United States Patent
De Bruijn et al.

(10) Patent No.: US 7,755,070 B2
(45) Date of Patent: Jul. 13, 2010

(54) ARRANGEMENT FOR THE SUPPRESSION OF UNWANTED SPECTRAL COMPONENTS IN A PLASMA-BASED EUV RADIATION SOURCE

(75) Inventors: René De Bruijn, Goettingen (DE); Chinh Duc Tran, Goettingen (DE); Bjoern Mader, Hannover (DE); Jesko Brudermann, Goettingen (DE); Juergen Kleinschmidt, Goettingen (DE)

(73) Assignee: XTREME technologies GmbH, Goettingen (DE)

( * ) Notice: Subject to any disclaimer, the term of this patent is extended or adjusted under 35 U.S.C. 154(b) by 651 days.

(21) Appl. No.: 11/539,342

(22) Filed: Oct. 6, 2006

(65) Prior Publication Data
US 2007/0080307 A1    Apr. 12, 2007

(30) Foreign Application Priority Data
Oct. 7, 2005    (DE)    ........................ 10 2005 048 670

(51) Int. Cl.
*H01L 21/027*    (2006.01)
*G21K 3/00*    (2006.01)
*G03F 7/20*    (2006.01)

(52) U.S. Cl. ............................. 250/504 R; 250/492.2; 359/358; 359/886

(58) Field of Classification Search ............... 359/358, 359/886; 250/492, 504
See application file for complete search history.

(56) References Cited

U.S. PATENT DOCUMENTS

| | | | |
|---|---|---|---|
| 1,969,655 A | * | 8/1934 | Mailey ..................... 204/157.4 |
| 2,474,712 A | * | 6/1949 | Aparicio .................... 359/886 |
| 3,456,108 A | * | 7/1969 | Pichoir ......................... 378/45 |
| 3,617,928 A | * | 11/1971 | Hausmann .................... 372/90 |

(Continued)

FOREIGN PATENT DOCUMENTS

DE    102 15 469    11/2003

(Continued)

OTHER PUBLICATIONS

U.S. Appl. No. 60/699,278, Sogard, filed Jul. 13, 2005.*

*Primary Examiner*—Jack I Berman
(74) *Attorney, Agent, or Firm*—Frommer Lawrence & Haug LLP

(57) ABSTRACT

The invention is directed to an arrangement for the suppression of unwanted spectral components ('out-of-band' radiation, as it is called) in a plasma-based radiation source. The object of the invention is to find a novel possibility for the suppression of unwanted spectral components in radiation exiting from a plasma-based EUV radiation source which permits a simple suppression of out-of-band radiation outside the desired EUV range without requiring costly manufacturing and adjustment of diffraction gratings. This object is met according to the invention in that a filter unit is provided between the plasma and an application location of the EUV radiation, which filter unit has at least one gas curtain comprising at least one rapidly flowing gas whose molecules have no absorption maxima for the desired EUV radiation and intensive absorption maxima for other, unwanted wavelengths that are emitted, at least in the IR region. For the purpose of generating the gas curtain, at least one slit nozzle and an efficient gas sink are arranged laterally opposite one another with respect to an optical axis of the beam bundle in order to limit the gas curtain in a spatially defined manner and to remove it again from the vacuum chambers as completely as possible.

27 Claims, 6 Drawing Sheets

U.S. PATENT DOCUMENTS

| | | | |
|---|---|---|---|
| 4,152,049 A * | 5/1979 | Hausmann | 359/892 |
| 6,198,792 B1 * | 3/2001 | Kanouff et al. | 378/34 |
| 2002/0097385 A1 | 7/2002 | Van Elp et al. | |
| 2003/0015669 A1 | 1/2003 | Janos et al. | |
| 2003/0142280 A1 | 7/2003 | Bakker et al. | |
| 2004/0109149 A1 | 6/2004 | Elp et al. | |
| 2005/0122491 A1 | 6/2005 | Bakker et al. | |
| 2007/0012889 A1 * | 1/2007 | Sogard | 250/504 R |
| 2007/0051954 A1 | 3/2007 | Yan | |
| 2009/0218521 A1 * | 9/2009 | Sogard et al. | 250/504 R |

FOREIGN PATENT DOCUMENTS

| | | |
|---|---|---|
| EP | 0 174 877 | 3/1986 |
| EP | 1 555 573 | 7/2005 |
| EP | 1 596 252 | 11/2005 |
| JP | 2006080108 A * | 3/2006 |
| WO | 03/007341 | 1/2003 |

* cited by examiner

ARRANGEMENT FOR THE SUPPRESSION OF UNWANTED SPECTRAL COMPONENTS IN A PLASMA-BASED EUV RADIATION SOURCE

CROSS-REFERENCE TO RELATED APPLICATION

This application claims priority of German Application No. 10 2005 048 670.3, filed Oct. 7, 2005, the complete disclosure of which is hereby incorporated by reference.

BACKGROUND OF THE INVENTION a) Field of the Invention

The invention is directed to an arrangement for the suppression of unwanted spectral components ('out-of-band' radiation, as it is called) in a plasma-based radiation source, particularly for the suppression of infrared (IR), visible (VIS), ultraviolet (UV) and/or deep ultraviolet (DUV) spectral components which are typically generated along with short-wavelength radiation, e.g. X-radiation to EUV radiation.

b) Description of the Related Art

For applications in semiconductor lithography, semiconductor wafers require increasingly higher EUV outputs to be generated by plasma-based radiation sources. However, the output of DUV, UV, VIS and IR wavelengths which is emitted by the plasma in addition to the desired EUV radiation is ten-times or multiple-times higher than the output in the desired EUV wavelength band (12-14 nm).

Further, the mirror optics used for EUV lithography reflect particularly UV, VIS and IR radiation appreciably better (~90%) than the desired EUV wavelengths (~65%). Since there are approximately ten mirrors contained in EUV lithography systems, this reduces the proportion of EUV radiation transferred to the wafer even more drastically. Further, a thin radiation-sensitive film (comprising a resist) which is provided on the wafer for the lithography process for generating the desired semiconductor structures is not only sensitive to the desired EUV radiation, but also partially absorbs the UV, VIS and IR radiation. Therefore, the resist is heated and expands. Of course, UV and DUV spectral components also especially influence the resist optically, which impairs the high exposure accuracy needed in EUV lithography. Therefore, it is important to filter out as much of the output of unwanted wavelength components (out-of-band radiation) as possible before reaching the wafer.

On one hand, out-of-band radiation is emitted directly by the plasma. On the other hand, it is also emitted by the components for generating the plasma, e.g., by the electrode system (when using a gas discharge plasma) or by a debris filter which is installed very near the plasma in order to intercept fast particles and materials which can condense at room temperature and is heated by the plasma (and possibly by hot generated components). Therefore, every hot object in the EUV radiation path is a source of out-of-band radiation.

Because of the short relaxation time of plasma, the radiation of the very hot plasma is generated in a pulsed manner with a pulse length of less than one microsecond, while the VIS radiation and IR radiation are emitted almost continuously. This latter results from the fact that the hot generated components in the vicinity of the plasma emit continuous IR radiation because of their long cooling period which is much longer than the time between two pulses. Only the fluctuations caused by the pulsed plasma corresponding to the source frequency are superimposed on this continuous radiation.

Many different solutions are known from the prior art for suppressing out-of-band radiation. One of the oldest solutions is the use of filter foils. In this solution, a spectral bandpass filter based on a thin foil window is used at the output of the EUV radiation source. However, because of the high power density of the EUV radiation at high repetition frequency, this foil is exposed to very high thermal loads and high-energy particles from the plasma and therefore to the risk of uncontrolled destruction. This is normally countered by permanently advancing a band-shaped filter. A disadvantage of this filter principle consists in that the potential risk of destruction of the filter membrane is only reduced but cannot be eliminated assuming that the filter band is advanced only very slowly or partially at long intervals for cost reasons.

Further, the publication US 2002/0097385 A1 describes a lithographic projection device in which a grating spectral filter is used for filtering the EUV light. The filter is a reflection grating (echelon grating) for grazing incidence which preferably comprises a material that is transparent to the desired EUV radiation. In a further development according to US 2004/0109149 A1, additional cooling is provided at the back of the substrate of the diffraction grating, and combinations with an upstream gas flow are provided for debris mitigation.

US 2004/0051954 A1 likewise discloses a spectral filter in the form of a reflection diffraction grating. The diffraction gratings are generated by anisotropic etching techniques in a silicon substrate as smooth, flat facets which are defined by (111) crystallographic planes of the substrate.

The solutions mentioned above are disadvantageous primarily because of the highly accurate manufacturing requirements and adjusting requirements for the diffraction gratings to achieve the desired filtration and the high susceptibility of the surfaces to contamination, e.g., by carbon deposits.

OBJECT AND SUMMARY OF THE INVENTION

It is the primary object of the invention to find a novel possibility for the suppression of unwanted spectral components in radiation exiting from a plasma-based EUV radiation source which permits a simple suppression of out-of-band radiation outside the desired EUV range without requiring costly manufacturing and adjustment of diffraction gratings which are prone to contamination.

In an arrangement for the suppression of unwanted spectral components in an EUV radiation source based on a plasma in which vacuum chambers are provided for plasma generation and for the transmission of the emitted EUV radiation to an application, wherein high-vacuum conditions are implemented for low-absorption transmission of the EUV radiation to an application location, the above-stated object is met in that a filter unit is provided between the plasma and an application location of the EUV radiation, which filter unit has at least one gas curtain comprising at least one rapidly flowing gas whose atoms or molecules have no absorption maxima for the desired EUV radiation and intensive absorption maxima for other, unwanted wavelengths that are emitted, at least in the IR region, and in that for the purpose of generating the gas curtain at least one slit nozzle and an efficient gas sink are arranged laterally opposite one another with respect to an optical axis of the beam bundle in order to limit the gas curtain in a spatially defined manner and to remove it again from the vacuum chambers as completely as possible.

In an advantageous manner, at least one gas curtain is arranged transverse to the optical axis of a beam bundle, which is focused for transmission to the application, in the vicinity of an intermediate focus.

The filter unit advisably has at least one gas curtain comprising an ensemble of differently absorbing media so that the absorption characteristics of the gas curtain can be adjusted through the composition of the different media.

The gas curtain advantageously has at least one of the absorbing media alkanes, alcohols, carboxylic acids, or water for absorbing substantial infrared (IR) spectral components. The gas curtain preferably contains at least one of the media methane ($CH_4$), methanol ($CH_3OH$) and formic acid (CHOOH) in order to filter out IR radiation (e.g., temperature radiation of the components generating the plasma between 800 K and 1300 K) in the range from 2.85 µm to 3.55 µm through absorption.

It has proven useful that the gas curtain additionally contains media for absorption of wavelengths from at least one of the spectral regions VIS, UV or DUV.

The gas curtain advisably contains at least one of the absorbing media ozone ($O_3$), nitrogen dioxide ($NO_2$), nitrate radicals ($NO_3$) or diluted air for absorbing visible (VIS) spectral components.

In order to filter out ultraviolet (UV) spectral components by absorption, at least one of the absorbing media nitrogen ($N_2$), oxygen ($O_2$), ozone ($O_3$) or diluted air is advantageously used to generate the gas curtain.

The gas curtain preferably has at least one of the absorbing media argon (Ar), chlorine-containing substances, e.g., $CH_3Cl$, methane ($CH_4$), oxygen ($O_2$), ozone ($O_3$), nitrogen ($N_2$) or diluted air for absorbing deep ultraviolet (DUV) spectral components.

The absorption properties of the gas curtain are advantageously adjusted by means of a mixing station which is arranged in front of a common slit nozzle and is provided for defined mixing of differently absorbing media.

In another advisable construction, the filter unit has a plurality of successively arranged gas curtains which are generated by supplying media with different absorption characteristics from different slit nozzles, and their absorption characteristics can accordingly be adjusted individually with respect to efficiency and the bandwidth that is filtered out. The successively arranged slit nozzles are preferably provided for injecting pure media with different absorption wavelengths or for injecting mixtures of media absorbing different spectra.

The filter unit can be additionally supplemented by media for debris absorption. In this connection, an additional gas curtain comprising an inert gas, preferably a noble gas, e.g., argon, is advisably provided, or a solid state filter foil, preferably a beryllium foil, is arranged following final gas curtain. The additional filter foil keeps the following vacuum chamber free of the unwanted load of gases dissipating from the filter unit and can be a spectral filter and a debris filter at the same time.

In order to increase the contrast (ratio) between wanted (in-band) radiation and unwanted (out-of-band) radiation through application of the gas curtain, the slit nozzles advisably have a slit width such that the attenuation of the unwanted spectral regions is greater by at least one order of magnitude than that of the wanted EUV radiation.

At least one gas curtain of the filter unit is advantageously arranged downstream of first collector optics for bundling the radiation that is emitted divergently from the plasma. However, it is advisably arranged in the immediate vicinity of an intermediate focus of the radiation that is emitted in a bundled manner in order to keep the surface of the gas curtain small and therefore to minimize disruption of the vacuum through dissipating gas.

To further reduce disruption of the vacuum, it is advantageous to arrange a diaphragm downstream of the final gas curtain of the filter unit in direction of the application, which diaphragm unrestrictedly passes the bundle of radiation transmitted to the application location under high vacuum and reduces dissipation of molecules of the gas curtain into the subsequent vacuum chamber in direction of the application.

It is also advisable to arrange a diaphragm downstream of the gas curtain in direction of the application, which diaphragm unrestrictedly passes the bundle of radiation transmitted to the application under high vacuum and reduces a dissipation of molecules of the gas curtain in direction of the application.

In order to achieve a complete separation of the gas curtain from the subsequent vacuum chamber because of the high-vacuum conditions, a filter foil is advantageously arranged in the diaphragm. This filter foil is additionally arranged as a defined edge filter for the EUV radiation to be transmitted to the application location following at least one gas curtain which has absorbed at least substantial IR components, so that the risk of destruction of the filter foil by thermal loading is appreciably reduced.

To provide additional thermal protection for a solid state spectral filter of this kind, an absorption foil is preferably stretched across a cooled holder frame, e.g., a ring through which a coolant flows. The holder frame is advisably traversed by thermally conductive supporting threads as a carrier net for the filter foil, and the supporting threads are oriented as far as possible to existing shadows of a debris filter arranged in front. In particular cases, the thermal loading of a solid state spectral filter of this kind can also be sufficiently small without preceding spectrally absorbing gas curtains when the spectral filter unit is arranged at a location of the emitted radiation having a large bundle cross section, e.g., directly downstream of the collector optics.

The filter unit can advisably also contain curtains of liquid media comprising either gases that are liquefied by cooling or which are still liquid at the pressures and operating temperatures prevailing in the vacuum chambers.

The invention is based on the consideration that because of the high temperature of the radiation-generating plasma and because of the high energy density, the solid state spectral filter which absorbs bundled EUV radiation for the suppression of unwanted spectral components (IR, VIS, UV and DUV) becomes very hot, particularly due to intensive IR radiation, and is destroyed within a very short time. Further, a solid state filter may only be very thin because otherwise too much of the wanted EUV radiation would be absorbed. However the total output in the beam bundle is so large that the absorption would promptly lead to the destruction of the solid state filter even if the latter were very thin.

The invention solves this problem in that a defined gas flow is used in the manner of a gas curtain as a spectral filter, wherein the gas curtain can be composed of a plurality of gases whose absorption cross section is much smaller in the EUV region than the absorption cross sections for IR, VIS, UV and/or DUV radiation in order to cover the wavelength regions to be suppressed by absorption of different gas molecules with different absorption mechanisms (e.g., resonance absorption in molecular bonds). In addition, it is also possible to apply a solid state spectral filter for spectral filtration to prevent disruption of the vacuum chamber due to gas dissipation from a gas curtain in that the thermal loading of a filter of this kind is reduced by at least one IR-absorbing gas curtain and/or by efficient cooling mechanisms.

The solution according to the invention makes it possible to suppress unwanted (out-of-band) spectral components in the radiation coming from a plasma-based EUV radiation source in a simple and reliable manner without the need to fabricate and adjust costly diction gratings. The invention increases the contrast (the ratio) between the wanted (in-band) EUV radiation and the out-of-band radiation. The gas or a plurality of gases is applied as a gas curtain. The radiation from the plasma penetrates the gas curtain approximately orthogonally and permits the absorption of almost all out-of-band radiation while absorbing only a small portion of the EUV radiation.

The invention will be described more fully in the following with reference to embodiment examples.

DESCRIPTION OF THE PREFERRED EMBODIMENTS

Figure 1:
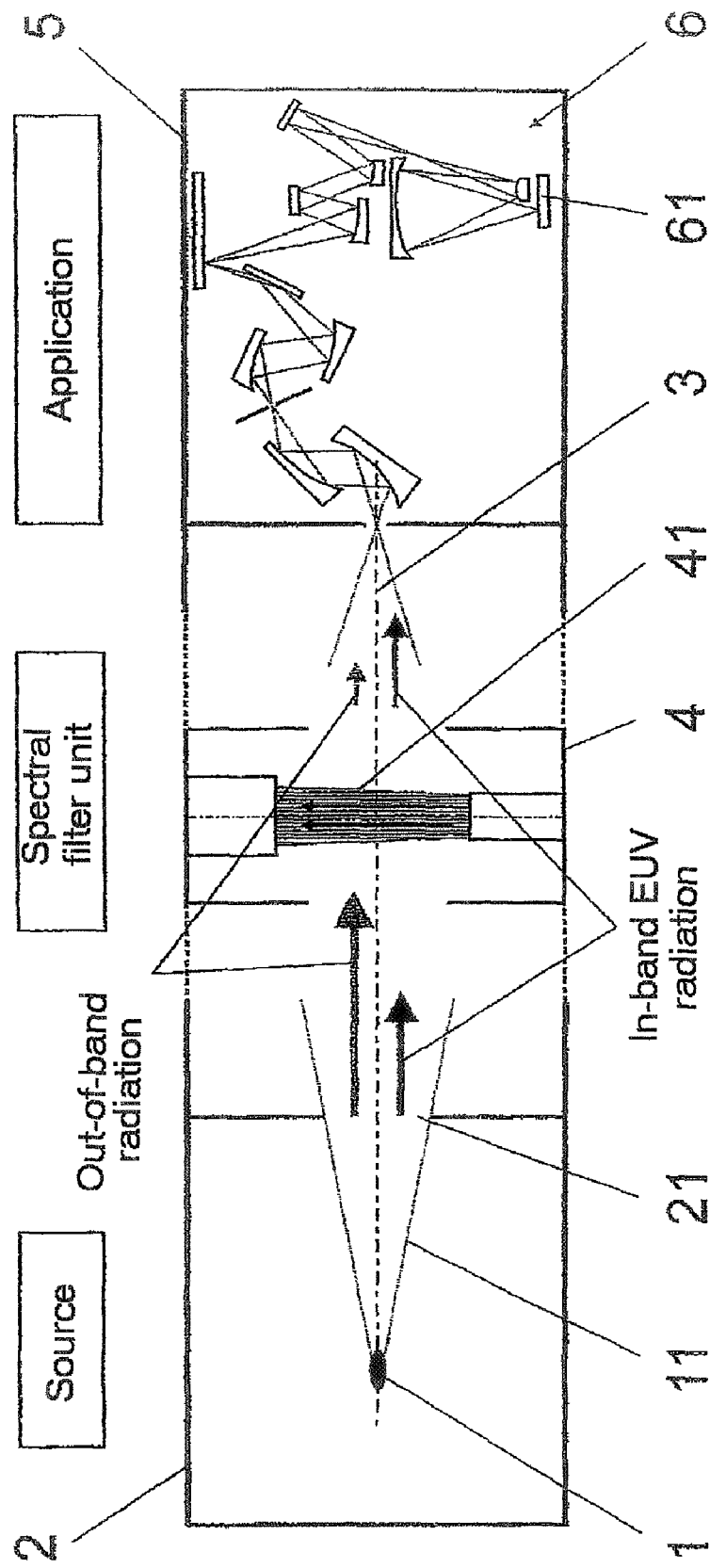
FIG. 1 shows the schematic construction of a plasma-based EUV radiation source with a spectral filter unit according to the invention using a gas curtain.

As is shown in FIG. 1, the basic construction of the arrangement according to the invention comprises the source location of the radiation source in the form of a dense, hot plasma 1 which is generated (in any desired manner) inside a vacuum chamber 2, a light path which, characterized by an optical axis 3, is determined by a bundle of emitted radiation 11 which is coupled out of the vacuum chamber 2 through an outlet opening 21, a spectral filter unit 4 having at least one gas curtain 41 (or a plurality of gas curtains 41 to 44, shown only in FIG. 2), and another vacuum chamber 5 for substantially absorption-free transmission of the wanted EUV radiation (in-band EUV radiation) for the application 6 (e.g., imaging of structures on a wafer 61). For the purpose of generating defined gas curtains 41 (to 44), the spectral filter unit 4 has one or more slit nozzles 45, preferably ultrasonic nozzles, in order to generate gas curtains with high velocity and defined orientation (small divergence) so as to minimize gas dissipation into the volume of the vacuum chambers 2 and 5. At least one gas sink 46 is arranged across from the slit nozzles 45 with reference to the optical axis 3 of the emitted radiation 11 in order to extract the rapidly flowing gas quantities again as completely as possible. Efficient roots pumps (not shown) are preferably used for this purpose.

The basic function of the spectral filter unit 4 is the absorption of out-of-band radiation, particularly IR radiation, which makes up the largest portion of the unwanted spectral components and which is also the most problematic for filtration because of the heating of conventional filter arrangements. The spectral filtration is carried out in that chiefly gases which absorb IR components and cause almost no absorption in the EUV region are injected transverse to the beam bundle 11. Since this latter ideal state is almost never achieved when it is desired to filter out all unwanted spectral components (out-of-band radiation) as completely as possible, the operative guidelines are better outlined as follows. The contrast (i.e., the ratio) between EUV radiation and the unwanted components of IR, VIS, UV and DUV is increased by means of one or more gas curtains 41 to 44 (FIG. 2) in that the proportion of out-of-band radiation is absorbed (and therefore suppressed) substantially more vigorously than the wanted (in-band) EUV proportion of the radiation 11 emitted by the plasma 1.

Figure 2:
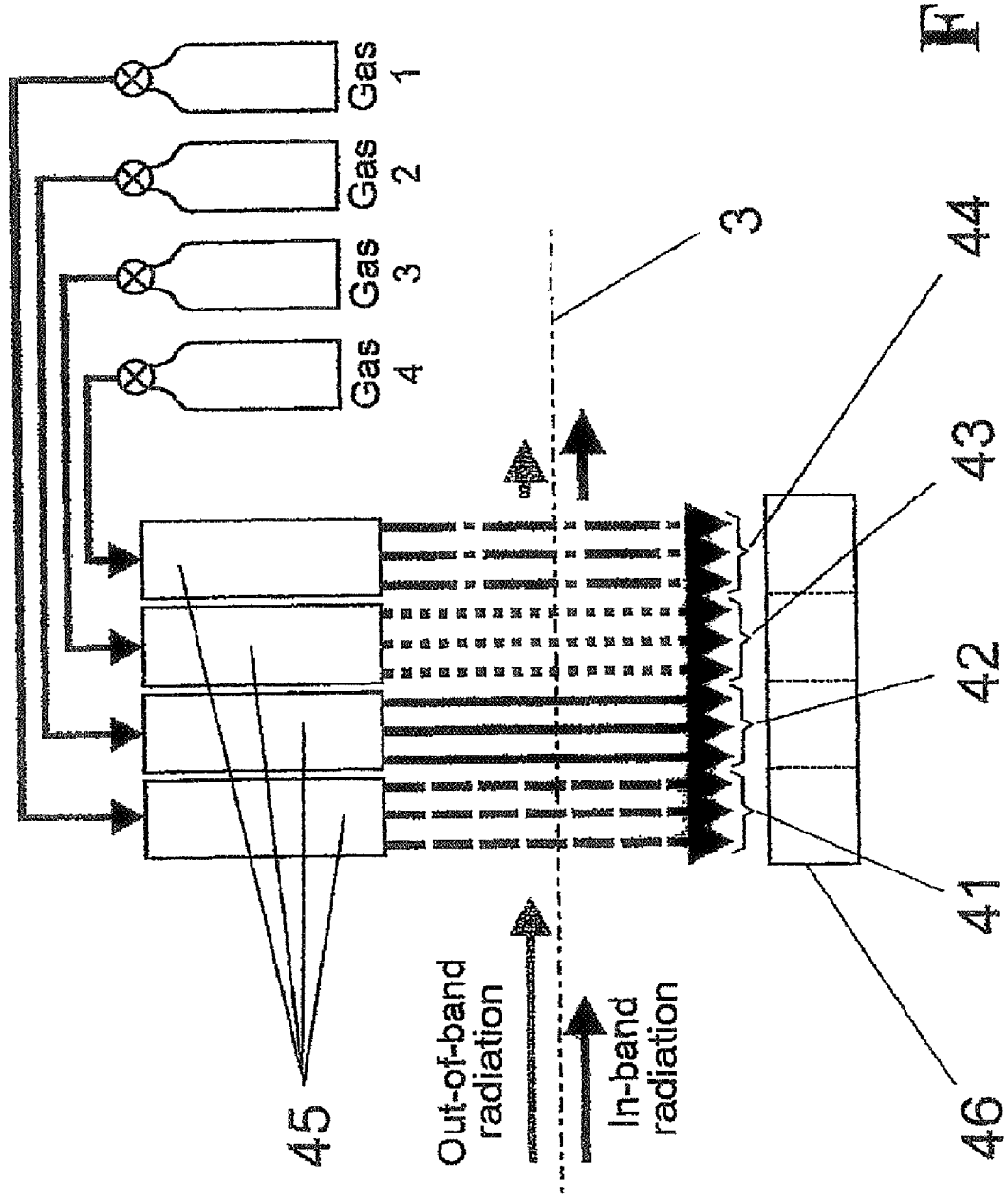
FIG. 2 shows a special design of the gas curtains according to the invention comprising a plurality of successive gas curtains with different gases.
Figure 3:
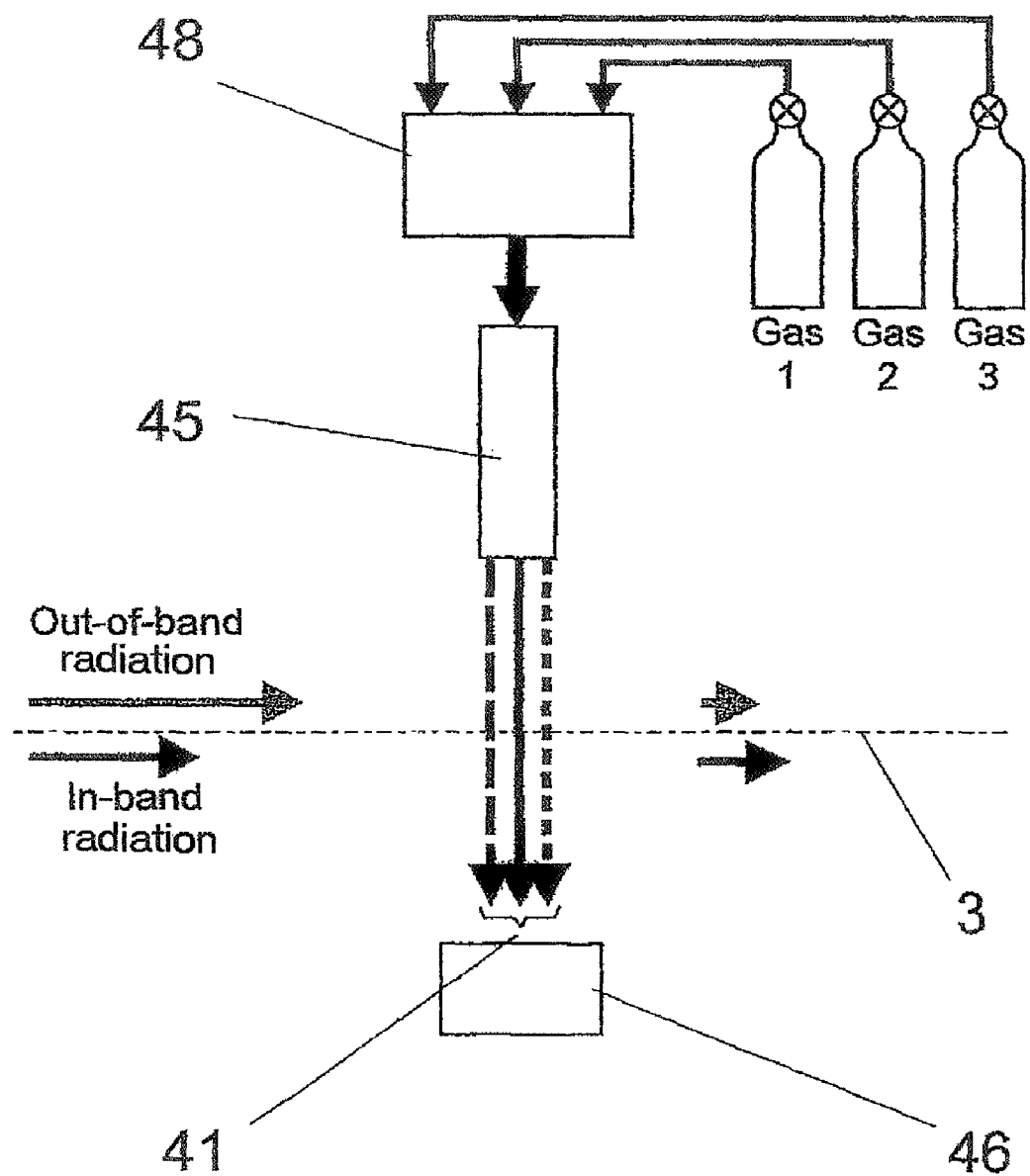
FIG. 3 shows another construction of the spectral filter unit according to the invention with a gas curtain comprising a mixture of several different types of gas.

Reference is had to FIG. 2 and FIG. 3 for the following descriptions for an efficient arrangement of gas curtains.

FIG. 2 shows a design of the spectral filter unit 4 working with a plurality of successive gas curtains 41 to 44. In this example, it is assumed that four different gases with different absorption characteristics respectively filter out different (also possibly overlapping) components of the out-of-band radiation. The gases which are supplied respectively by four individual slit nozzles 45 can also be mixtures (e.g., air) in order to optimize the absorption behavior of the entire filter unit 4. With reference to the optical axis 3 of the emitted beam 11 (shown only in FIG. 1) coupled out of the plasma 1, a (possibly partitioned) gas sink 46 is arranged across from the slit nozzles 45 in order to remove the injected gases from the vacuum again as completely as possible. As a result, the out-of-band radiation is attenuated appreciably more than the wanted EUV radiation (in-band radiation).

Another variant for suitable composition of gases for efficiently filtering out out-of-band radiation is indicated in FIG. 3. In this instance, the ratio of three gases (or mixtures) relative to one another is adjusted by a mixing station 48 so that a gas curtain 41 comprising a mixture of differently absorbing gas molecules is generated by the slit nozzle 45, traverses the beam 11 (represented in this instance by the optical axis 3) emitted by the plasma 1, and leads to optimal spectral filtration.

A suitable selection of gases or gas mixtures composed according to FIGS. 2 and 3 will be described in more detail with reference to different objectives of the spectral filtration.

The large bandwidth of the out-of-band radiation requires the use of different gases. A gas mixture should have a great many resonant frequencies in the out-of-band region and, ideally, no resonance in the EUV region (especially in the region around 13.5 nm for EUV lithography).

When the greatest proportion of radiation lies in the IR spectral region, molecules of light elements are needed, e.g., H, C, N, O or Cl. Light elements have little or no resonance in the EUV region (13.5±0.5 nm). The gas molecules can transform (absorb) input energy into stretching vibrations, bending vibrations, and/or rotation modes of molecular bonds.

Averaged over time, the temperature range of thermally heated electrodes or metallic debris filters is typically limited (by cooling) to temperatures between 800 K and 1300 K because the lifetime of these components would otherwise be too brief. At these temperatures, these components emit principally in the range of 3.6 μm (800 K) to 2.2 μm (1300 K). However, the plasma 1 should emit its highest output in the EUV range between 13 nm and 14 nm so that a successful selective filtration would seem possible.

For the suppression of the above-described IR components (the plasma-generating components in the immediate vicinity of the plasma) having their highest output between 2.2 μm and 3.6 μm, the following bonds can be used:

stretching vibrations of CH bonds in alkanes: 2.85 μm-3.0 μm, stretching vibrations of OH bonds in alcohols: 3.2 μm-3.55 μm, and stretching vibrations of OH bonds in carboxylic acids: 2.5 μm-3.3 μm.

These are all intensive resonances leading to considerable absorption. Accordingly, in this example for the absorption of IR radiation the gas curtain can comprise methane ($CH_4$), methanol ($CH_3OH$) and formic acid (CHOOH). Naturally, other gases can be added to absorb other wavelengths in case this mixture is still not sufficient for an adequately high IR absorption.

In general, the following media are suitable for filtering out thermal radiation from the NIR region to the IR region (1-20 μm): $CH_4$, $NH_3$, $CO_2$, $H_2O$, CO, NO, $N_2O$, $NO_2$, $CH_3OH$ (methanol). Further, all greenhouse gases are good filter candidates.

The efficiency of the gas curtain can be evaluated by considering the ratio between the absorption in the IR region (up to NIR~1 μm) and the EUV region (12 nm to 14 nm). It is clear that the higher the ratio, the more advantageous the gas curtain.

The ratio between EUV radiation and IR radiation is approximately 20 for $NH_3$, while it is about 10 for $CH_4$ when considering the vibration mode with the greatest absorption. However, in practice several different vibration modes will absorb simultaneously and, as a result, an even higher efficiency is achieved but without expecting absorption that is higher by more than an order of magnitude.

Figure 4:
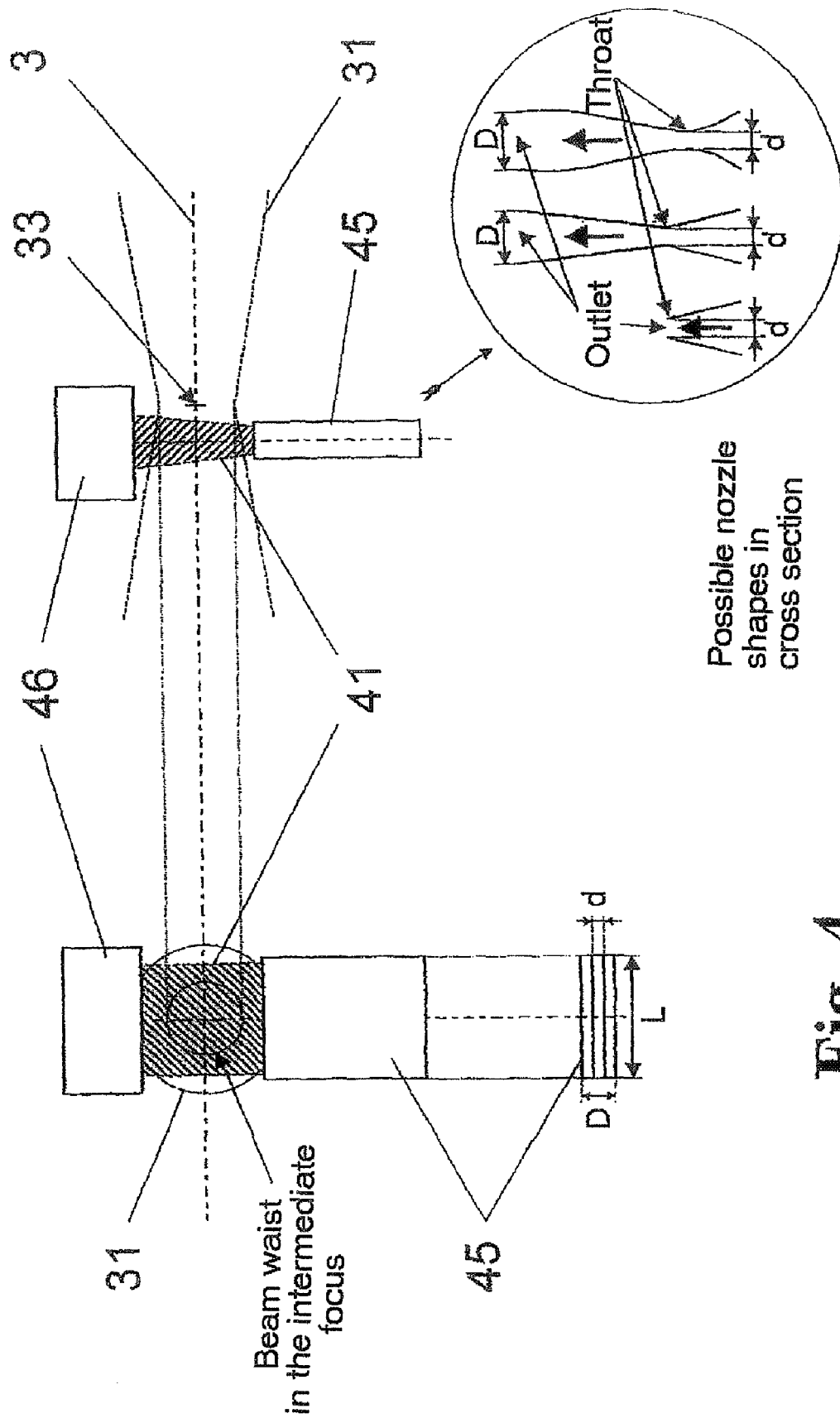
FIG. 4 shows the spectral filter unit in a front view, side view and top view and a detailed view of possible nozzle shapes (slit nozzles) for generating a defined gas curtain.
Figure 6:
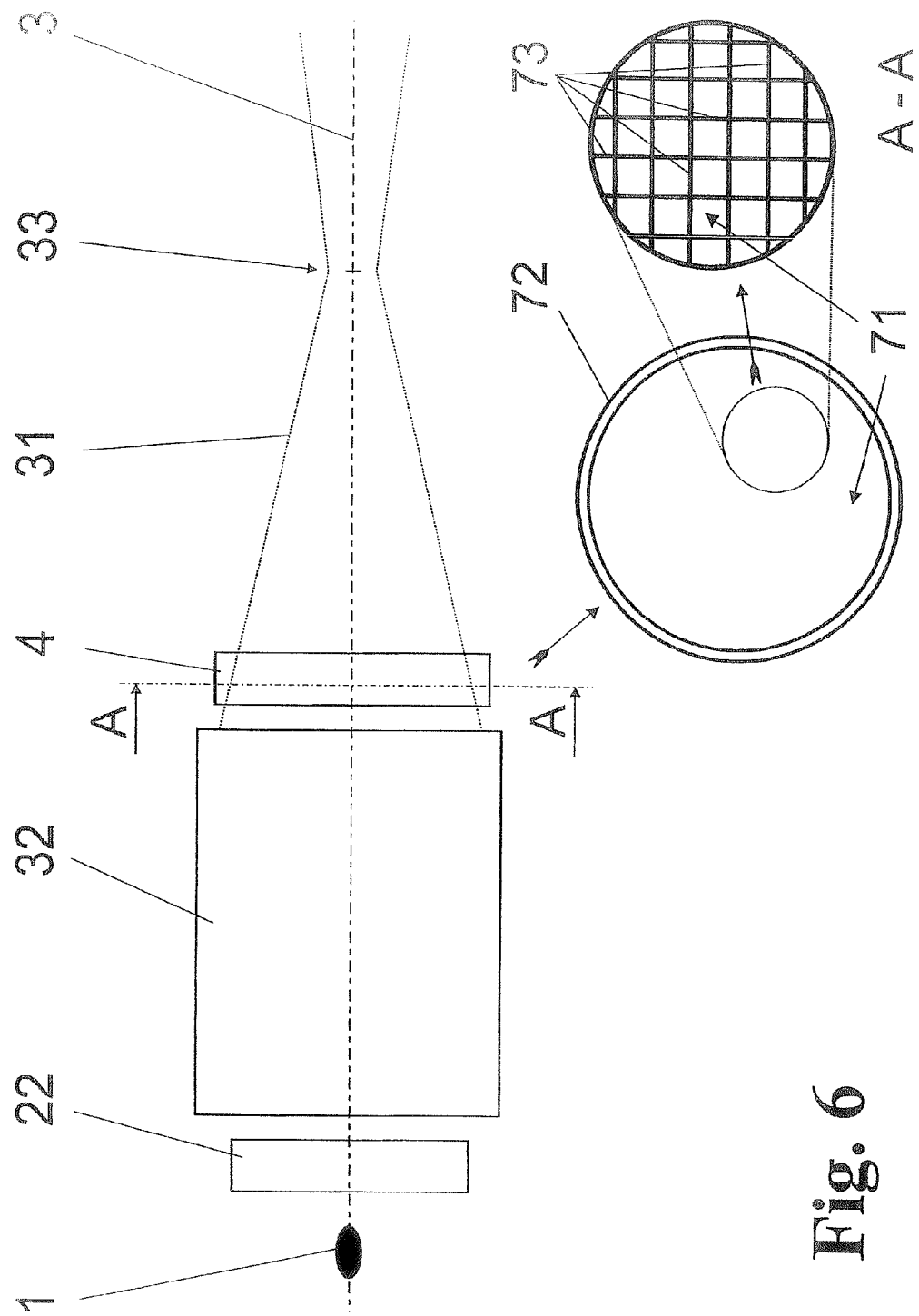
FIG. 6 shows a schematic diagram for the generation of the gas curtain by different embodiment forms and for extracting the gas at opposite sides of the beam bundle emitted by the plasma.

As is shown in FIG. 4, one of the most advantageous positions for one or more gas curtains of the spectral filter unit 4 is the immediate vicinity of the intermediate focus 33 after first collector optics 32 (only shown schematically in FIG. 6). The extension of the intermediate focus 33, i.e., its diameter, is determined by the characteristics of the collector optics 32, i.e., by magnification and numerical aperture. Focus diameters are typically on the order of about 1 cm.

According to FIG. 4, the gas curtain 41 is generated by means of a slit nozzle 45 which is preferably constructed in Laval geometry, i.e., a converging-diverging nozzle. The slit nozzle 45 itself need not necessarily have curved portions as is shown at bottom-right in FIG. 4 in an enlarged section as nozzle shape (c), but rather can also have flat converging and diverging portions according to view (b). In the simplest case, a slit nozzle 45 is only conical according to example (a) can also be selected.

FIG. 4 shows a front view in direction of the optical axis 3 (top-left), a side view lateral to the optical axis 3 (top-right), and a top view (bottom-left). The gas sink 46 which is also required above the optical axis 3 in the top view is omitted from the top view for the sake of clarity. Further, the slit nozzle 45 in the top view was selected as a converging-diverging nozzle as shown in the detailed views (b) or (c).

While the cross section of the slit nozzle 45 is not completely determined with respect to its shape and still permits variations in shape, it is indispensable that the slit nozzle 45 is an ultrasonic nozzle so that the gas flow which exits from the slit nozzle 45 and must form a defined gas curtain 41 with a defined density and thickness is not allowed to dissipate in an uncontrolled manner into the vacuum chambers 2 and 5.

An ultrasonic nozzle generates a slightly divergent gas flow of high intensity so that a gas sink 46 in the form of a suction device with attached roots pump can extract the gas as completely as possible from the vacuum. The ultrasonic slit nozzle 45 is characterized by its width d, its throat, the angle of divergence, and the width D of the output. In order to generate a gas curtain 41 which is as homogeneous as possible, the length L of the slit nozzle 45 should be greater than the width D of the output.

A suitable slit nozzle 45 having a throat width d=0.2 mm, a slit length L=15 mm, and a half cone angle of 2 degrees has a Mach number of 2.4 (for the gases relevant in this connection with an adiabatic exponent γ~1.3). The dimensions of the gas curtain 41 are then 0.5×15 $mm^2$ at the nozzle outlet D and 1.6×15 $mm^2$ at the entrance to the gas sink 46. In this case, the diameter of the intermediate focus 33 in the focused bundle 32 of the collector 31 is assumed to be less than 15 mm, but can also be smaller.

Referring to the example selected above, when the slit nozzle 45 admits $NH_3$, a gas pressure on the order of 1 bar is required. As a result, the gas pressure in the gas curtain 41 corresponds to about 0.1 bar in the area of the optical axis 3. At this location, the path length l of the beam of the focused bundle 32 through the gas curtain 41 is assumed to be l~0.8 mm, and the product of pressure p and path length l, which is a constant along the entire diverging gas curtain, is p·l=80 mbar·mm. The required gas flow is set at about 1 $g·s^{-1}$ and corresponds to 1.3 liters per second.

Nitrogen ($N_2$), oxygen ($O_2$), ozone ($O_3$) or, in the simplest case, diluted air which contains all of these gases in part can be used for the gas curtain in order to suppress chiefly UV spectral components in the beam bundle 32 emitted from the plasma 1.

Ozone ($O_3$), nitrogen dioxide ($NO_2$) and nitrate radicals ($NO_3$) are particularly suitable for filtering out visible light (VIS). Some of these materials absorb over a large bandwidth not only in the UV or VIS region but also in the IR region, e.g., water ($H_2O$). Diluted air (possibly with some additions for absorption of certain insufficiently covered wavelengths) can likewise be used for a gas curtain with good UV/VIS/IR filtration.

A gas curtain comprising at least one of the absorbing media argon (Ar), chlorine-containing substances, e.g., $CH_3Cl$, methane ($CH_4$), oxygen ($O_2$), ozone ($O_3$), nitrogen ($N_2$) or diluted air must be generated for absorbing deep ultraviolet (DUV) spectral components.

In principle, the gas curtain 41 can occupy any position between the source location (plasma 1) and the application 6 of the radiation because the basic concern is only to prepare the EUV radiation needed for semiconductor lithography without unwanted spectral components for the application 6 (exposure of a wafer 61). However, in certain cases it is recommended that the location of spectral filtration be set up only after first collector optics 32, since this allows the surface of the gas curtain 41 to be made considerably smaller and accordingly reduces efforts for shaping the gas flow (length L of the slit nozzle 45) and for the extraction of the gas (dimensions and efficiency of the gas sink 46) after traversing the focused beam bundle 31.

Particularly in the case of a laser-generated plasma 1 (but without limiting to this), collector optics 32 (mirror optics) which are typically arranged at a distance of only 10 cm to 20 cm from the plasma 1 for bundling the radiation that is emitted divergently by the plasma 1 have a high temperature due to the energy introduced by the plasma 1, i.e., the collector optics 32 themselves act as an IR source in the transmitted beam bundle 31. Further, when liquid metals or metal vapor, e.g., lithium (Li), is used specifically for generating the EUV radiation, the collector optics 32 are advisably even heated additionally in order to substantially prevent the coating of the mirror surfaces with condensing metal (e.g., lithium). Therefore, a gas curtain 41 should be arranged after the collector optics 32, even when there is already a gas curtain 41 in front of the collector optics 32.

As is shown schematically in FIG. 2, the gas curtain 41 can be formed by a plurality of individual curtains located one behind the other, for example, by four gas curtains 41 to 44 arranged successively. Each gas curtain 41 has a certain target region for the spectral filter function. When four gas curtains 41 to 44 are provided, the first gas curtain 41 can be provided at the source side for absorption of UV and VIS radiation, the second gas curtain 42 for IR radiation, the third gas curtain 43 for DUV radiation, and the fourth gas curtain 44 for preventing diffusion of gas from the third gas curtain 43 into the vacuum of the high-vacuum chamber 5 arranged downstream. This configuration is presented only by way of example, additional curtains can also be applied for fulfilling other specific functions (e.g., debris filtration).

Figure 5:
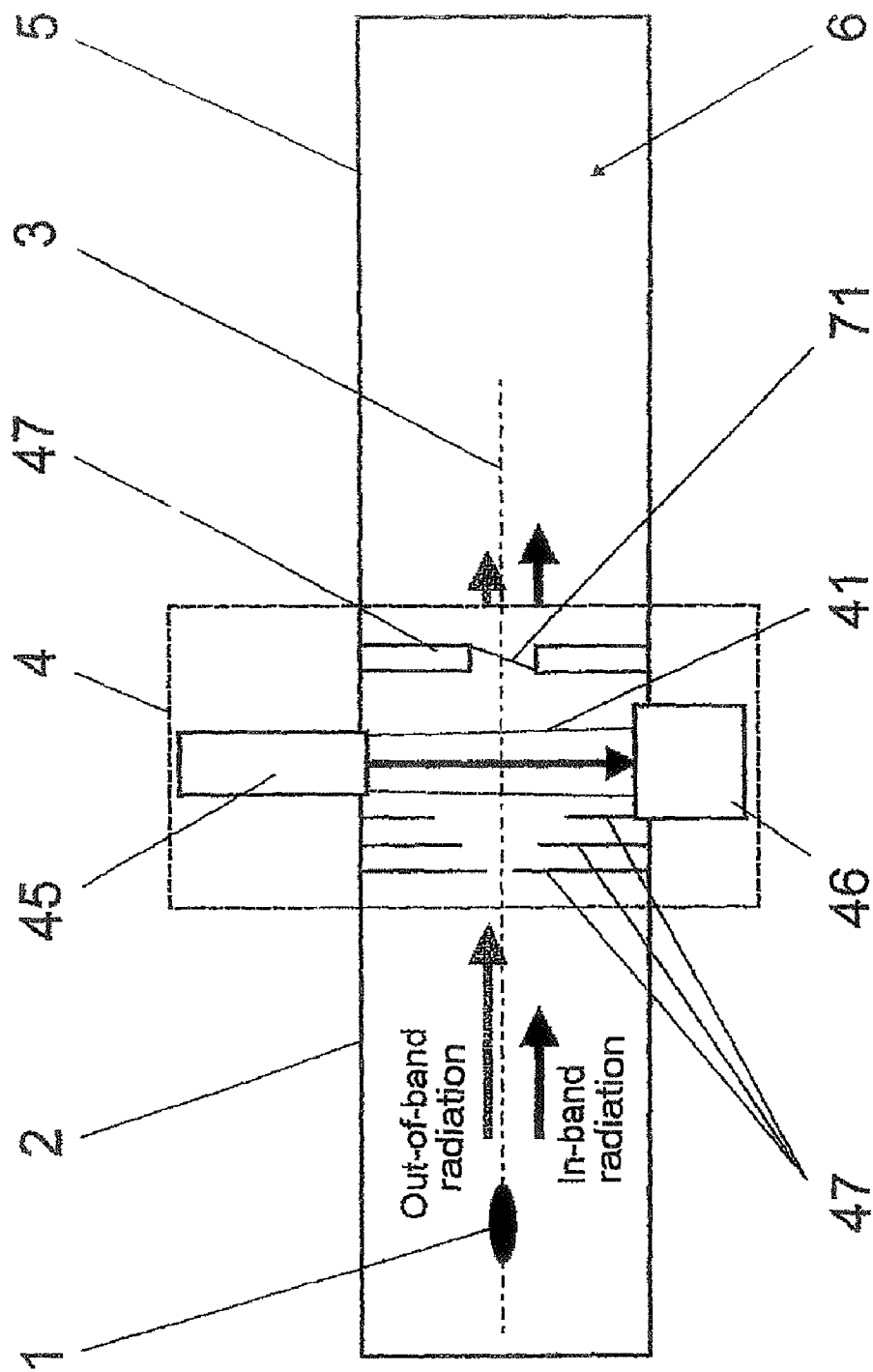
FIG. 5 shows a schematic diagram of an EUV radiation source with a spectral filter unit which contains flat diaphragms in front of the gas curtain and a solid state spectral filter arranged downstream for reducing the gas dissipation in vacuum chambers arranged upstream and downstream.

Another possibility for mitigating the effects of the gas curtain 41 to 44 on the vacuum chambers 2 and 5 is shown schematically in FIG. 5. In this case, only one gas curtain 41 is shown for the sake of simplicity. Three diaphragms 47 which impede the exit of gas molecules from the gas curtain 41 into the vacuum chamber 2 are arranged in the spectral filter unit 4 as a shield for the vacuum chamber 2 in which the plasma 1 is generated. It is also useful to provide a diaphragm 47 in direction of vacuum chamber 5, which is characterized by a high vacuum, in order to keep the absorption of the wanted EUV radiation as low as possible. In this example, the diaphragm 47 is even hermetically closed by a solid state spectral filter 7. In this case, the spectral filter 7 can safely be used because the thermal loading (always a problem in the prior art) can no longer destroy it due to the at least one gas curtain 41 which has sufficiently filtered out the IR radiation. The solid state spectral filter 7, which should absorb very little in-band radiation, can be a very thin absorption foil 71 of beryllium (Be), zirconium (Zr), niobium (Nb), molybdenum (Mo), silicon (Si), or silicon nitride ($Si_3N_4$).

Further, according to FIG. 5, the solid state filter 7 following the gas curtain 41 in direction of the application 6 can also be a debris filter which likewise hermetically separates the gas curtain 41 from the high-vacuum chamber 5 in which the lithographic exposure optics are located.

For a solid state spectral filter 7 which should absorb very little in-band radiation and which has a very thin absorption foil 71 of beryllium (Be), another possibility exists for improving its mechanical and thermal durability thanks to the excellent thermal conductivity of beryllium. As is shown in the detail at bottom right in FIG. 6, this consists in that the absorption filter foil 71 is arranged on a cooled holder frame 72 arranged outside of the EUV beam bundle. Additional supporting threads 73 within the holder frame 72 which are provided for stabilization and for improved transfer of heat from the absorption foil 71 to the holder frame 72 are advantageously arranged in such a way that they are located geometrically in shadowed areas which already exist due to a debris filter 22 arranged in front.

The solid state spectral filter 7 described above can also be used without a gas curtain 41 arranged in front of it when the absorption foil 71 arranged on the cooled holder frame 72 is so arranged that the radiation output from the plasma 1 is distributed to a larger surface, e.g., directly following the collector optics 32 and relatively far from a (first) intermediate focus 33. The position of the spectral filter unit 4 which is reduced to this extent and which contains only the solid state spectral filter 7 is shown in the main part of FIG. 6. In this case, the low power density which is not yet focused is utilized immediately following the collector optics 32. The farther the location of the spectral filter unit 4 is shifted in direction of the intermediate focus 33, the greater the thermal loading, so that at least one gas curtain 41 must necessarily be arranged in front for reducing IR radiation.

While the foregoing description and drawings represent the present invention, it will be obvious to those skilled in the art that various changes may be made therein without departing from the true spirit and scope of the present invention.

REFERENCE NUMBERS 1 plasma
11 (coupled-out bundle of) emitted radiation
2 vacuum chamber
21 outlet opening
22 debris filter
3 optical axis
31 (focused) beam bundle
32 collector optics
33 intermediate focus
4 spectral filter unit
41-44 gas curtain
45 slit nozzle
46 gas sink
47 diaphragm
48 mixing station
5 high-vacuum chamber
6 application
61 wafer
7 solid state spectral filter
71 absorption foil
72 cooled holder frame
73 supporting threads
D outlet width (of the slit nozzle)
d throat width (of the slit nozzle)
L slit length (of the slit nozzle)

What is claimed is:

1. An arrangement for the suppression of unwanted spectral components in an EUV radiation source based on a plasma comprising:

vacuum chambers being provided for plasma generation and for the transmission of the emitted radiation to an application, wherein high-vacuum conditions are implemented for low-absorption transmission of the EUV radiation to an application location;

a spectral filter unit being provided between the plasma and an application location of the EUV radiation;

said filter unit having at least one rapidly flowing gas curtain comprising gases whose atoms or molecules have no absorption maxima for the desired EUV radiation between 13 nm and 14 nm but have different complementing intensive absorption maxima for other, unwanted wavelengths that are emitted, at least in the IR region; and for the purpose of generating the gas curtain, at least one slit nozzle and an efficient gas sink being arranged laterally opposite one another with respect to an optical axis of a beam bundle, which can be coupled out from the plasma, in order to limit the gas curtain in a spatially defined manner and to remove it again from the vacuum chambers as completely as possible.

2. The arrangement according to claim 1;
wherein the at least one gas curtain is arranged transverse to the optical axis of a beam bundle, which is focused for transmission to the application, in the vicinity of an intermediate focus.

3. The arrangement according to claim 1;
wherein the filter unit has at least one gas curtain comprising an ensemble of differently absorbing media which is adjustable with respect to its absorption characteristics.

4. The arrangement according to claim 1;
wherein the filter unit has at least one gas curtain comprising at least one of the absorbing media alkanes, alcohols, carboxylic acids, or water for absorbing spectral components.

5. The arrangement according to claim 4;
wherein the filter unit has at least one gas curtain comprising at least one of the media methane ($CH_4$), methanol ($CH_3OH$) and formic acid (CHOOH) in order to filter out IR radiation in the range from 2.85 µm to 3.55 µm through absorption.

6. The arrangement according to claim 4;
wherein the filter unit has at least one gas curtain with additional media for absorption of wavelengths from at least one of the spectral regions VIS, UV or DUV.

7. The arrangement according to claim 6;
wherein the filter unit has at least one gas curtain comprising at least one of the absorbing media ozone ($O_3$), nitrogen dioxide ($NO_2$), nitrate radicals ($NO_3$) or diluted air for absorbing visible (VIS) spectral components.

8. The arrangement according to claim 6;
wherein the filter unit has at least one gas curtain comprising at least one of the absorbing media nitrogen ($N_2$), oxygen ($O_2$), ozone ($O_3$) or diluted air for absorbing UV spectral components.

9. The arrangement according to claim 6;
wherein the filter unit has at least one gas curtain comprising at least one of the absorbing media argon (Ar), chlorine-containing substances for absorbing DUV spectral components.

10. The arrangement according to claim 1;
wherein the filter unit has a mixing station which is arranged in front of a slit nozzle and which is provided for the defined mixing of differently absorbing media so that the gas curtain is adjustable with respect to its absorption characteristics.

11. The arrangement according to claim 1;
wherein the filter unit has a plurality of successively arranged gas curtains which are generated by separate feeds of media with different absorption characteristics from different slit nozzles, and their absorption characteristics can accordingly be adjusted individually with respect to efficiency and the bandwidth that is filtered out.

12. The arrangement according to claim 11;
wherein the successively arranged slit nozzles inject pure media with different absorption wavelengths.

13. The arrangement according to claim 11;
wherein the successively arranged slit nozzles inject mixtures of media absorbing different spectra.

14. The arrangement according to claim 11;
wherein the filter unit is outfitted, in addition, with media for debris absorption.

15. The arrangement according to claim 14;
wherein an additional gas curtain comprising an inert gas is provided.

16. The arrangement according to claim 14;
wherein a solid state spectral filter is arranged following the final gas curtain, wherein this solid state filter in the form of an absorption foil keeps the following vacuum chamber free from loading by gases dissipating from the filter unit.

17. The arrangement according to claim 1;
wherein the slit nozzles have a slit width such that the attenuation of the unwanted spectral regions is greater by at least one order of magnitude than that of the wanted EUV radiation.

18. The arrangement according to claim 1;
wherein at least one gas curtain of the filter unit is arranged downstream of first collector optics for bundling the radiation that is emitted divergently from the plasma.

19. The arrangement according to claim 18;
wherein the gas curtain is arranged in the immediate vicinity of an intermediate focus of the radiation that is emitted in a bundled manner in order to keep the surface of the gas curtain small and therefore to minimize disruption of the vacuum.

20. The arrangement according to claim 19;
wherein at least one diaphragm is arranged upstream of the gas curtain in direction of the plasma, which diaphragm unrestrictedly passes the bundle of radiation emitted by the plasma and reduces dissipation of molecules of the gas curtain in direction of the plasma.

21. The arrangement according to claim 19;
wherein at least one diaphragm is arranged downstream of the gas curtain in direction of the application, which diaphragm unrestrictedly passes the bundle of radiation transmitted to the application location under high vacuum and reduces a dissipation of molecules of the gas curtain into the subsequent vacuum chamber in direction of the application.

22. The arrangement according to claim 21;
wherein a diaphragm with a filter foil inserted therein is arranged downstream of the gas curtain and forms a complete separation of the gas curtain from the subsequent vacuum chamber and is provided as a defined edge filter for the EUV radiation to be transmitted to the application to supplement the at least one gas curtain which has absorbed at least substantial proportions of the IR spectral region.

23. The arrangement according to claim 1;
wherein the filter unit contains curtains of media comprising gases that are liquefied by cooling.

24. The arrangement according to claim 1;
wherein the filter unit contains curtains of media which are liquefied by very low vacuum pressures and operating temperatures prevailing in the vacuum chambers.

25. The arrangement according to claim 1;
wherein the nozzle and the gas sink have such a length to width ratio that the gas curtain has an about 10 to 30 times greater lateral extension than in longitudinal direction along the optical axis.

26. The arrangement according to claim 1;
wherein the nozzle and the gas sink have such a length to width ratio that the gas curtain has a thickness in the order of magnitude around 1 mm and a lateral extension of at least 10 times greater.

27. The arrangement according to claim 1;
wherein the nozzle and the gas sink have such a length to width ratio that the gas curtain has a thickness of less than 2 mm and a lateral extension of at least 10 times greater.

* * * * *